US010315224B2

(12) United States Patent
Joyce et al.

(10) Patent No.: US 10,315,224 B2
(45) Date of Patent: Jun. 11, 2019

(54) ULTRASONIC TRANSDUCER

(71) Applicant: uBeam Inc., Santa Monica, CA (US)

(72) Inventors: Andrew Joyce, Venice, CA (US); Sean Taffler, Pacific Palisades, CA (US); Paul Reynolds, Issaquah, WA (US); Jonathan Lake, Hidden Hills, CA (US)

(73) Assignee: uBeam Inc., Marina del Rey, CA (US)

( * ) Notice: Subject to any disclaimer, the term of this patent is extended or adjusted under 35 U.S.C. 154(b) by 281 days.

(21) Appl. No.: 15/154,899

(22) Filed: May 13, 2016

(65) Prior Publication Data

US 2016/0339476 A1 Nov. 24, 2016

Related U.S. Application Data

(60) Provisional application No. 62/164,108, filed on May 20, 2015.

(51) Int. Cl.

*H01L 41/053* (2006.01)
*B06B 1/06* (2006.01)
*G10K 9/122* (2006.01)
*H01L 41/09* (2006.01)

(52) U.S. Cl.

CPC .......... *B06B 1/0666* (2013.01); *B06B 1/0603* (2013.01); *G10K 9/122* (2013.01)

(58) Field of Classification Search

CPC .................................................... B06B 1/0666
USPC ......................... 310/311, 328, 330–332, 365
See application file for complete search history.

(56) References Cited

U.S. PATENT DOCUMENTS

| | | | | |
|---|---|---|---|---|
| 4,204,096 | A | 5/1980 | Barcus et al. | |
| 4,961,345 | A * | 10/1990 | Tsuruoka | G01L 9/0016 73/32 A |
| 5,396,143 | A | 3/1995 | Seyed-Bolorforosh | |
| 5,982,709 | A | 11/1999 | Ladabaum et al. | |
| 6,430,109 | B1 | 8/2002 | Khuri-Yakub | |
| 6,445,108 | B1 | 9/2002 | Takeshima | |

(Continued)

FOREIGN PATENT DOCUMENTS

| | | | |
|---|---|---|---|
| WO | 2014143942 | A2 | 9/2014 |
| WO | 2014164018 | A1 | 10/2014 |

OTHER PUBLICATIONS

Invitation to Pay Additional Fees issued in PCT/US2016/033369 on Jul. 19, 2016.

(Continued)

*Primary Examiner* — Thomas M Dougherty
(74) *Attorney, Agent, or Firm* — Morris & Kamlay LLP

(57) ABSTRACT

Systems and techniques are provided for an ultrasonic transducer. A substrate may include a main cavity, a secondary cavity, and a channel. The main cavity may have a greater depth than the secondary cavity. The secondary cavity may have a greater depth than channel. A first step may be formed where the main cavity and the secondary cavity overlap. A second step may be formed where the secondary cavity and the main cavity overlap. An electromechanically active device may be attached to the substrate at the first step and the second step such that a free end of the electromechanically active device is suspended over the main cavity. A membrane section may be bonded to the substrate such that the membrane covers the main cavity and the secondary cavity and is bonded to the free end of the electromechanically active.

9 Claims, 12 Drawing Sheets

(56) References Cited

U.S. PATENT DOCUMENTS

| | | | | |
|---|---|---|---|---|
| 7,626,891 | B2 | 12/2009 | Chang | |
| 7,937,834 | B2 | 5/2011 | Chang et al. | |
| 8,040,020 | B2 | 10/2011 | Martin et al. | |
| 8,371,018 | B2 | 2/2013 | Chang | |
| 8,398,551 | B2 | 3/2013 | Adachi et al. | |
| 8,455,289 | B1 | 6/2013 | Adler et al. | |
| 8,531,919 | B2 | 9/2013 | Cheng et al. | |
| 9,313,578 | B2 | 4/2016 | Pang | |
| 9,968,332 | B2 * | 5/2018 | Tsuruno | A61B 8/4494 |
| 2004/0249285 | A1 | 12/2004 | Deng et al. | |
| 2005/0255668 | A1 | 11/2005 | Tseng et al. | |
| 2006/0043598 | A1 | 3/2006 | Kirby et al. | |
| 2007/0016071 | A1 | 1/2007 | Eberle et al. | |
| 2007/0113658 | A1 | 5/2007 | Combi et al. | |
| 2007/0153632 | A1 | 7/2007 | Chang et al. | |
| 2007/0164632 | A1 | 7/2007 | Adachi et al. | |
| 2007/0222339 | A1 | 9/2007 | Lukacs et al. | |
| 2007/0277618 | A1 | 12/2007 | Kroeger et al. | |
| 2008/0086056 | A1 | 4/2008 | Chang et al. | |
| 2008/0139946 | A1 | 6/2008 | Adachi et al. | |
| 2008/0185937 | A1 | 8/2008 | Ketterling et al. | |
| 2008/0235936 | A1 | 10/2008 | Chang et al. | |
| 2008/0290756 | A1 | 11/2008 | Huang | |
| 2008/0290757 | A1 | 11/2008 | Gao et al. | |
| 2010/0207484 | A1 | 8/2010 | Chang | |
| 2011/0068654 | A1 | 3/2011 | Cheng et al. | |
| 2011/0085684 | A1 | 4/2011 | Kim et al. | |
| 2011/0198970 | A1 | 8/2011 | Martin et al. | |
| 2011/0242932 | A1 | 10/2011 | Lebental et al. | |
| 2013/0140704 | A1 | 6/2013 | alder et al. | |
| 2013/0160555 | A1 | 6/2013 | Buccafusca et al. | |
| 2014/0069194 | A1 | 3/2014 | Kim | |
| 2014/0264651 | A1 | 9/2014 | Dehe et al. | |
| 2015/0082890 | A1 | 3/2015 | Pant et al. | |
| 2015/0281845 | A1 | 10/2015 | Pang | |
| 2016/0233413 | A1 * | 8/2016 | Zawada | H01L 41/053 |
| 2016/0339628 | A1 * | 11/2016 | Joyce | B06B 1/0666 |
| 2016/0340178 | A1 | 11/2016 | Joyce et al. | |

OTHER PUBLICATIONS

International Search Report and Written Opinion dated Aug. 16, 2016 as received in Application No. PCT/US2016/033371.

International Search Report and Written Opinion dated Aug. 16, 2016 as received in Application No. PCT/US2016/033372.

Extended European Search Report for App No. 16797340.3 dated Jan. 3, 2019, 11 pages.

* cited by examiner

ULTRASONIC TRANSDUCER

CROSS REFERENCE TO RELATED APPLICATIONS

This application claims priority to U.S. Provisional Patent Application No. 62/164,108, filed on May 20, 2015.

BACKGROUND

Electromechanically active devices may be used in a variety of applications. For example, electromechanically active devices may be used in transducers, sensors, and, actuators. In some uses, the electromechanically active device may be used to generate soundwaves, including ultrasonic sound waves, through vibration of the electromechanically active device. A membrane, or diaphragm, may be added to the electromechanically active device to provide additional surface area to move a medium, such as the air, with the vibrations of the electromechanically active device.

BRIEF SUMMARY

According to an implementation of the disclosed subject matter, a substrate may include a main cavity. An electromechanically active device may be attached to the substrate such that a free end of the electromechanically active device is suspended over a bottom of the main cavity. A membrane section may be bonded to the substrate and the electromechanically active device.

A substrate may include a main cavity, a secondary cavity, and a channel. The main cavity may have a greater depth than the secondary cavity, the secondary cavity may have a greater depth than channel, a first step may be formed at a location where the main cavity and the secondary cavity overlap, and a second step may be formed at a location where the secondary cavity and the main cavity overlap. An electromechanically active device may be attached to the substrate at the first step and the second step such that a free end of the electromechanically active device is suspended over a bottom of the main cavity. A membrane section may be bonded to the substrate such that the membrane covers the main cavity and the secondary cavity and is bonded to the free end of the electromechanically active device such that vibration of the electromechanically active device at ultrasonic frequencies causes the membrane to vibrate at ultrasonic frequencies.

A substrate may include two main cavities. Two electromechanically active devices may be attached to the substrate such that a free end of a first of the two electromechanically active device is suspended over a bottom of a first of the two main cavities and a free end of a second of the two electromechanically active device is suspended over a bottom of a second of the two main cavities. A membrane may be bonded to the substrate such that a first membrane section covers the first of the two main cavities and a second membrane section covers a second of the two main cavities. The first membrane section may be bonded to the first of the two electromechanically active devices and the second membrane section may be bonded to the second of the two electromechanically active devices.

Systems and techniques disclosed herein may allow for an ultrasonic transducer Additional features, advantages, and embodiments of the disclosed subject matter may be set forth or apparent from consideration of the following detailed description, drawings, and claims. Moreover, it is to be understood that both the foregoing summary and the following detailed description are examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
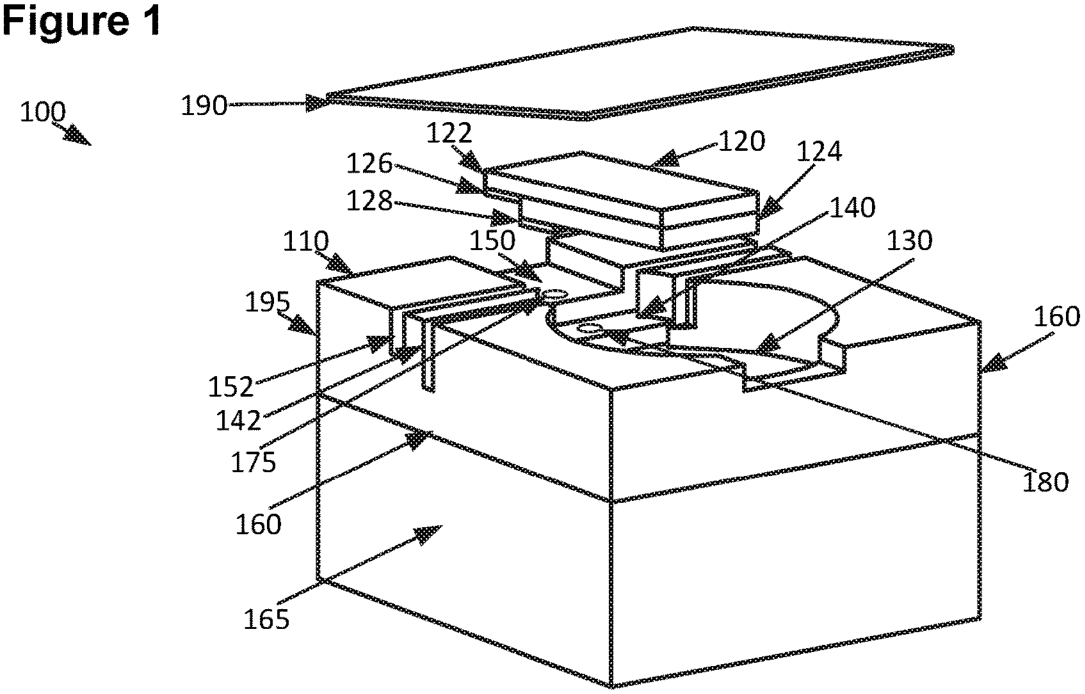
FIG. 1 shows an example ultrasonic transducer according to an implementation of the disclosed subject matter.

An ultrasonic transducer may include an electromechanically active device, such as a cantilever or flexure, attached to the wall of a cavity in a substrate. The electromechanically active device may be made from a laminate material, and may include electrodes. The substrate may include a step structure with vias which may be in contact with the electrodes of the electromechanically active device. The ultrasonic transducer may include a membrane which may cover a top surface of the ultrasonic transducer, and may be attached to the electromechanically active device. The substrate of the ultrasonic may be a layer of a printed circuit board (PCB), or may be a rigid material such as copper or aluminum. A rigid material may be attached to the bottom of the ultrasonic transducer. Multiple ultrasonic transducers may be created using the same piece of substrate, forming an electromechanical transducer array.

An ultrasonic transducer may include a substrate. The substrate may be any suitable material, and may be, for example, the top layer of a PCB with any suitable number of layers. The top layer of the PCB may be a non-conductive material such as, for example, FR-4. The substrate may be in any suitable shape, and the surface of the substrate may be flat, or may be curved or textured in any suitable manner. The substrate may include recessed features. The substrate may define the structure of the ultrasonic transducer, provide electrical contact, rigidly secure the electromechanically active device and allow a variation of the rigidity with which the electromechanically active device is secured. The substrate may form a base for an electromechanical transducer array, which may include a number of ultrasonic transducers. Recessed cavities in the substrate may be used to provide positioning and positive alignment during construction of an electromechanical transducer array including a number of ultrasonic transducers. The substrate may be made and structured in any suitable manner, for example, using PCB manufacturing techniques. For example, the recessed cavities may be created with mill holes. Layer lamination, dicing saw cuts and epoxy filled vias may be used to create the structure of the substrate. The structure of the substrate may also be created using negative mold casting or an ordering of subtractive processes. The substrate may be the top, non-conductive layer of a PCB, which may allow for the breakout of the ultrasonic transducers of the electromechanical transducer array through the conductive layers of the PCB and connecting vias. The use of PCB as a substrate may also allow for electrical control circuitry for the electromechanical transducer array to be placed onto the back-side of the PCB of the electromechanical transducer array. Other materials such as ceramics, plastics, or metals, including, for example, aluminum, copper, silicon/aluminum alloy, and silicon, which may be coated or anodized to be non-conductive, may also be used as or in the substrate, and may offer differing levels of mechanical support for the cantilevers in the elements of the electromechanical transducer array. For example, the substrate may be aluminum, and may be attached to the top layer of a PCB in any suitable manner.

The substrate may be designed, for example, using sub-dicing with a dicing saw, which may disrupt lateral and parasitic modes of oscillation among electromechanically active devices of the electromechanical transducer array. The substrate may be made of materials of any suitable stiffness. The stiffness of the materials of the substrate may determine the rigidity of the base to which the electromechanically active device may be bonded. The substrate may be non-planar, and may also be flexible. The substrate may be anisotropic. The sub-diced sections of the substrate may be left empty, or may be filled with another material, such as an absorbing material such as silicone rubber.

A cavity of an ultrasonic transducer may be any suitable shape and have any suitable depth. For example, the cavity may be circular. The electromechanically active device may be attached to the wall of the cavity in any suitable manner. For example, a step structure, or shelves, may be created on an edge of the cavity, and the electromechanically active device may be bonded to the step structure using any suitable adhesive, such as, for example, conductive epoxy. The step structure may be created by creating an additional cavity in the substrate. The additional cavity may partially overlap the cavity, and may be shallower than the cavity. This may create a step at the location where the additional cavity overlaps the cavity, and the additionally cavity may appear as crescent shape in the substrate. A second step may be created by creating a channel of any suitable shape in the substrate, partially overlapping the additional cavity. The channel may be shallower than the additional cavity, creating the second step at the location of the overlap. The step and the second step may be aligned. The length of the tread, or shelf, or each step in the step structure to which the electromechanically active device may be bonded may determine the resonant free-length of the electromechanically active device. The recessed surfaces of the substrate, such as the cavities, may be designed to permit bonds of varying and controllable strength to the electromechanically active device, which may affect the performance of the electromechanically active device and the output of the ultrasonic transducer. Altering the length of the area to which the electromechanically active device may be bonded may affect the frequency and amplitude, or velocity of output, or amplitude, of the ultrasonic transducer. The structure of the substrate may provide clearance for the electromechanically active device to move both up and down over any suitable distance.

The step structure of the substrate may be further defined by trenches, which may be created to any suitable depth, and may cross through each overlap location. For example, a trench having the same depth as the cavity may be created at the overlap of the cavity and the additional cavity, and a trench having the same depth as the additional cavity may be created at the overlap of the channel and the additional cavity. The trenches may, for example, be used to create a flat front wall, or riser, for the step and the second step. The cavity, additional cavity, channel, and trenches may be created in the substrate of the ultrasonic transducer in any suitable manner, including through subtractive processes, such as drilling, milling, and dicing saw cuts, and through additive processes.

The substrate may include any suitable number of vias. The vias may be, for example, patterned in pairs offset from one another. One via of a pair of vias may make electrical contact with an electrode for an electrically passive layer, such as a conductive metal, of an electromechanically active device. For example, the electrode may contact the via on the tread of a step of the step structure of the substrate. The other via of the pair of vias may make contact with an electrode on an electrically active material, such as a piezoceramic, of the electromechanically active device. For example, the electrode may contact the other via on the tread of the other step of the step structure. The electrodes may be, for example, thin-film electrodes. The vias may be filled with a conductive epoxy so that when a dicing saw is used to create the recesses, such as the step structure, to accommodate the electromechanically active device, there may be reduced risk of losing conductivity at the electrical contact points of the vias.

The substrate may include any number of vias for a single electromechanically active device. The vias may be any suitable combination of blind vias, buried vias, and through vias. Other numbers of vias, and different types of connections with two vias, may be used to establish electrical connectivity with the ultrasonic transducers of an electromechanical transducer array. For example, with one via, the connection to an ultrasonic transducer of an electromechanical transducer array may be hot connection to an electromechanically active device, with a common ground. With two vias, the connections to an ultrasonic transducer may be a hot connection and a ground connection, or a positive connection and a negative connection. With three vias, the connections to an ultrasonic transducer may be two hot connections and one ground connection, two ground connection and one hot connection, or a positive connection, a negative connection, and a ground connection. The structure of the substrate may allow for electrical isolation between the components of the electromechanical transducer array.

An ultrasonic transducer may include an electromechanically active device attached to the substrate. The electromechanically active device may be a cantilever or flexure, and may be, for example, a piezoceramic unimorph, bimorph, or trimorph. The electromechanically active device may include an electrically active material, such as piezoelectric material or piezoceramic, electrostrictive material, or ferroelectric material, which may able to transform electrical excitation into a high-frequency vibration to produce ultrasonic acoustic emissions. The geometry of an electromechanically active device may affect the frequency, velocity, force, displacement, capacitance, bandwidth, and efficiency of electromechanical energy conversion produced by the electromechanically active device when driven to output ultrasound and the voltage and current generated by the electromechanically active device and efficiency of electromechanical energy conversion when driven by received ultrasound. The electromechanically active device may have a rectangular profile, or may have a profile based on any other suitable geometry, such as, for example, a trapezoidal geometry. The geometry of the electromechanically active device may be selected, for example, to tune the balance and other various characteristics of the electromechanically active device. The electromechanically active device may be made using single layer of piezoelectric material laminated onto a single passive substrate material. The electromechanically active device may also be made with a single piezoelectric layer and multiple passive layers; two piezoelectric layers operating anti-phase, or two piezoelectric layers, operating anti-phase and combined with one or more electrically passive materials. Different layers of the electromechanically active device may have different shapes. For example, in a unimorph, a piezoelectric material may be shaped differently from a passive substrate material to which the piezoelectric material is bonded. The piezoelectric material, for example, piezoceramic, used in the electromechanically active device may be poled in any suitable manner, with polarization in any suitable direction.

The electromechanically active device may be any suitable size for use in an ultrasonic transducer, and for vibrating at ultrasonic frequencies. For example, the electromechanically active device may have a width of between 0.5 mm and 1.5 mm, a height of between 0.4 mm and 0.5 mm, and a length of between 2.0 and 3.0 mm, though different layers of the electromechanically active device may have different lengths to allow bonding with the stair structure of the substrate. The electromechanically active device may be made in any suitable manner, such as, for example, by cutting rectangular geometries from a larger laminate material. The laminate material may be made from, for example, an electrically active material, such a piezoceramic, bonded to an electrically inactive substrate, such as, for example, metals such as aluminum, Invar, Kovar, silicon/aluminum alloys, stainless steel, and brass, using any suitable bonding techniques and materials. The materials used may be non-optimal for the performance of an individual electromechanically active device. For example, materials may be selected for consistent performance across a larger number of electromechanically active device or for ease of manufacture. An electromechanically active device may include a tail which may be used in securing the electromechanically active device onto the substrate of the ultrasonic transducer, and may facilitate electrical contact, for example, with a via in the substrate. The tail of the electromechanically active device may protrude beyond the substrate of the ultrasonic transducer. The tail may be structured through a subtractive process, for example, with ceramic material being cut away from the electromechanically active device. An additive process may also be used, for, example, with the piezoelectric layer of a laminate material first structured to the desired geometry and then bonded onto the passive substrate material with a pitch approximately equal to the desired length of the electromechanically active device, after which the rectangular electromechanically active device may be cut out of the bonded materials.

The electromechanically active device may be oriented in the cavity at any suitable angle. For example, the electromechanically active device may oriented along a diameter of a circular cavity, and may reach approximately halfway across the cavity. The top surface of the electromechanically active device, which may be, for example, a passive material of a unimorph or an active material of a bimorph, may be level, or near-level, with the top of the cavity. The electromechanically active device may be attached to the substrate of an ultrasonic transducer in any suitable manner. For example, any of the underside or both sides of the electromechanically active device may be bonded to the substrate, for example, at the step structure of the substrate. The bonds used to secure the electromechanically active device to the substrate may be any suitable combination of organic or inorganic bonds, using any suitable conductive and non-conductive bonding materials, such as, for example, epoxies or solders. The area of contact between the electromechanically active device and the substrate may be any suitable size and shape. In some implementations, an ultrasonic transducer may include more than one electromechanically active device within a cavity. The ultrasonic device may include any number of ultrasonic transducers in any suitable arrangement.

The electromechanically active device may be bonded in a suitable position on the substrate, with the passive or active layers of the electromechanically active device facing down depending on whether the electromechanically active device is a unimorph, bimorph, trimorph, or has some other structure. The bond may use any suitable bonding agent, solder, or epoxy. For example, conductive adhesive film may be applied to the areas of the electromechanically active device to be bonded to the substrate. The electromechanically active device may be pressed into the substrate and drawn back so that a back wall of the electromechanically active device may be pulled flush against the step structure of the substrate. The electromechanically active device may be placed onto the substrate by, for example, a pick and place machine using a UV release tape to pick up the electromechanically active device. The conductive adhesive film may be cured, after which the electromechanically active device may be separated from the UV release type by exposure to the release agent, for example, UV light. The area to which an electromechanically active device may be bonded may extend outside a single ultrasonic transducer and into a neighboring ultrasonic transducer in an electromechanical transducer array, making use of otherwise unused space on the opposite side of each ultrasonic transducer. This may result in a small additional space at one edge of the electromechanical transducer array.

A membrane may be bonded to the ultrasonic transducer to create an ultrasonic device with a membrane. A membrane may be attached with adhesive in a manner that may define the outline of a number of cells of the electromechanical transducer array which the membrane will cover, where each cell may include an ultrasonic transducer. The electromechanically active device of a covered ultrasonic transducer may be bonded to the membrane, for example, at or near the tip of the electromechanically active device. A membrane may be multiple separate pieces of material, each of which may cover one ultrasonic transducer, or multiple ultrasonic transducers, or may be single piece of material which may cover all of the ultrasonic transducers of the electromechanical transducer array. A membrane may be aligned with one or more ultrasonic transducers and pressed into the substrate to form a covering layer. A membrane may act to acoustically couple the motion of cantilevers to the air, as the motion of cantilevers may cause the membrane to move. A membrane may be attached to the substrate in any other suitable manner, such as, for example, being melted or welded to, including being ultrasonically welded, laser welded, or electron beam welded to, or mechanically attached or pinned to, the substrate. The membrane may be bonded to the substrate, for example, using any suitable epoxy applied in any suitable manner.

The membrane may be any suitable material or composite material structure, which may be of any suitable stiffness and weight, for vibrating at ultrasonic frequencies. For example, the membrane may be both stiff and light. For example, the membrane may be aluminum shim stock, metal-patterned Kapton, or any other metal-pattern film. The membrane may be impedance matched with the air to allow for more efficient air-coupling of the ultrasonic transducers. The membrane may include additional structures, such as, for example, ring structures located on the membrane where the membrane will contact the tips of the electromechanically active devices.

The membrane may be attached to an electromechanical transducer array along bond lines, which may be, for example, cured epoxy. The bond lines may divide the electromechanical transducer array into ultrasonic transducer cells of any suitable shape, such as squares. The membrane may also be bonded to the tips of the free end of each electromechanically active device of the electromechanical transducer array. This may result in each ultrasonic transducer being covered with a section of the membrane that is bonded to the substrate around the ultrasonic transducer and also bonded to the tip of the free end of the ultrasonic transducer's electromechanically active device. The tip of the free end of the electromechanically active device may be slightly off being aligned with the center of the section of the membrane. This may allow the section of the membrane to be pushed outward by the electromechanically active device so that the highest point of the section of the membrane is at the center of the section of the membrane. Each section of the membrane may be able to move independently of any other section of the membrane, though the membrane may remain a single piece of material. The bond lines formed by the cured epoxy may mechanically isolate the sections of the membrane from each other. The movement of one section of the membrane may not be transmitted across a bond line, where the membrane is bonded to the substrate, to another section of the membrane.

An electromechanical transducer array may include any number of ultrasonic transducers. The ultrasonic transducers may share a common piece of material as a substrate, or may use any suitable number of separate pieces of material, for example, with each ultrasonic transducer having its own separate piece of substrate material. The ultrasonic transducers of an electromechanical transducer array may be divided into cells. Each cell may include a single ultrasonic transducer covered by a membrane or membrane section, or may include multiple ultrasonic transducers. The cells of may be any suitable shape, in any suitable pattern. For example, cells may be squares, rectangles, circles, hexagons, irregular polygons and have one or more curved boundaries. Cells may be arranged in any suitable pattern. For example, cells may be arranged in a grid pattern, circular pattern, or hexagonal pattern.

The substrate of an electromechanical transducer array may be a top layer of a PCB, or may be attached to the top layer of a PCB. ASICs and other electronics may be mounted on, or in, the electromechanical transducer array, for example, on or in the substrate or other layers of the PCB to which the substrate is attached. Components for one or more resistor-inductor-capacitor (RLC) circuits may also be embedded in the substrate. Batteries of any suitable size, and capacitors of any suitable capacity and with any suitable electrical properties, including supercaps, may be included in the electromechanical transducer array. The materials of the substrate may lend rigidity, for example, to a case or other housing that may contain or include an electromechanical transducer array, and may protect components of the electromechanical transducer array or other components. A layer of material may be attached to the bottom of the electromechanical transducer array to provide enhanced rigidity to the electromechanical transducer array and the ultrasonic transducers. For example, an aluminum plate may be bonded, in any suitable manner, to the back of the bottom of the electromechanical transducer array.

The substrate may be able to support a lateral mode caused by the electromechanically active devices, or may be able to transfer motion from one ultrasonic transducer to its neighbor. Any suitable techniques may be used in the design and manufacture of the substrate to minimize crosstalk and lateral modes. For example, the substrate may be sub-diced, which may include cutting a pattern to a certain depth into the rear side of the substrate with a saw. This may ensure that there is no path for any laterally propagating wave. Trenches created by sub-dicing may be filled with a damping or absorbing material such as silicone rubber to lessen transverse waves. Electrically insulating layers may be used, for example, in the trenches created by sub-dicing, for electrical cross-talk isolation of the various conductive components of electromechanical transducer array. Electrically conductive barriers may be used as shielding planes, for example, between cells of the electromechanical transducer array.

An electromechanical transducer array may be designed to accommodate the thermal expansion of the various materials it is made of, reducing or eliminating the effects of the thermal expansion on the performance of the electromechanical transducer array. An electromechanical transducer array may be design to be robust to shocks and impacts.

In some implementations, more than one membrane may bonded to an electromechanical transducer array. For example, multiple separate membranes of the same material, or different materials may be used to cover the ultrasonic transducers of an electromechanical transducer array. Different materials may be used, for example, to allow different sections of the ultrasonic device to have different operating characteristics.

FIG. 1 shows an example ultrasonic transducer according to an implementation of the disclosed subject matter. An ultrasonic transducer 100 may include a substrate 160, PCB 165, and membrane 190. The substrate 160 may be any suitable material, such as, for example, a non-conductive layer of a PCB such as FR-4, or a metal, such as aluminum, which may be more rigid than FR-4. The substrate 160 may be in any suitable shape and of any suitable thickness. The substrate 160 may include a main cavity 130, a secondary cavity 140, a channel 150, trenches 142 and 152, and an electromechanically active device 120. The substrate 160 may include any number of fiducials, which may be, for example, predrilled. The main cavity 130 may be a cavity in the substrate 160, formed through any suitable additive or subtractive processes, and may be any suitable shape and any suitable depth. For example, the main cavity 130 may be circular with a radius of between 1.0 mm and 1.5 mm, and may have a depth of between 0.5 mm and 0.6 mm. The secondary cavity 140 may be a cavity in the substrate 160 which may overlap the main cavity 130, and may be any suitable shape and any suitable depth. For example, the secondary cavity 140 may be a semi-circular cavity of less depth than the main cavity 130, such as, for example, between 0.4 mm and 0.5 mm, forming a first step at its intersection with the main cavity 130. The secondary cavity 140 may have a radius of, for example between 0.5 mm and 1.0 mm. The secondary cavity 140 may appear circular if created before the main cavity 130, but may appear as crescent shape when created after the main cavity 130, or after the main cavity 130 is created. The channel 150 may be a channel of any suitable width and depth, made in any suitable manner, which may run through the centers of the main cavity 130 and the secondary cavity 140. For example, the channel 150 may be made using a dicing saw cut of any suitable width through the main cavity 130 and the secondary cavity 140. The channel 150 may be shallower than the secondary cavity 140, so that the channel forms second step where it overlaps the secondary cavity 140. The second step may be in alignment with the first step. The channel 150 may run across a number of ultrasonic transducers, such as the ultrasonic transducer 100. For example, the ultrasonic transducers may be aligned in an electromechanical transducer array so that a straight line cut from a dicing saw may pass through the centers of all of the main cavities, such as the main cavity 130, and secondary cavities, such as the secondary cavity 140, in a group of aligned ultrasonic transducers. The main cavity 130, secondary cavity 140, and channel 150 may be created in the substrate 160 in any suitable order.

A riser of the first step may be further defined by the trench 142. The trench 142 may be created any suitable manner, for example, through a dicing saw cut, and may cross the main cavity 130 and the secondary cavity 140 at their overlap. The trench 142 may create a flat riser for the first step. A riser of the second step may be further defined by the trench 152. The trench 152 may be created in any suitable manner, for example, through a dicing saw cut, and may cross the secondary cavity 140 and the channel 150 at their overlap. The trench 152 may create a flat riser for the second step. The trenches 142 and 152 may have any suitable width, such as, for example, between 0.1 mm and 0.3 mm The first step may include a via 180, and the second step may include a via 175. The vias 175 and 180 may be any suitable vias, of any suitable size and shape. The vias 175 and 180 may be electrically conductive, and may, for example, be filled with an electrically conductive epoxy. The vias 175 and 180 may descend through the substrate 160 and provide an electrical connection to components of the PCB 165. The vias 175 and 180 may be created in the substrate 160 in any suitable manner, such as, for example, through the drilling of the substrate 160. The vias 175 and 180 may each be covered by an electrode to facilitate electrical connection through the vias 175 and 180. The vias 175 and 180 may have a diameter of, for example, 0.2 mm.

The electromechanically active device 120 may be any suitable electromechanically active device for vibration at ultrasonic frequencies, for example, frequencies over 20,000 Hz. The electromechanically active device 120 may be, for example, a piezoelectric unimorph or bimorph which may use piezoceramic material bonded to an electrically inactive substrate. The electromechanically active device 120 may be any suitable shape, and may, be for example, a cantilever or flexure. For example, the electromechanically active device 120 may include an electrically passive material 122, which may be, for example, stainless steel, aluminum, Invar, Kovar, or silicon/aluminum alloy, bonded to an electrically active material 124, which may be, for example, piezoceramic. The electromechanically active device 120 of the ultrasonic transducer 100 may be bonded to the substrate 160 at the first and second steps, with the free end of the electromechanically active device 120 projecting out, and suspended, over the bottom of the main cavity 130. The electrically passive material 122 may include an electrode 126, and the electrically active material 124 may include an electrode 128. When the electromechanically active device 120 is bonded to the substrate 160 at the first and second step, the electrode 126 may be aligned with the via 175 on the second step, and the electrode 128 may be aligned with the via 180 on the first step. The electrodes 126 and 128 may be bonded to the vias 175 and 180 using a conductive epoxy, which may allow for an electrical connection between the electromechanically active device 120 and the PCB 165 and its components. This may allow for the supply of an electrical current through the PCB 165 to the electromechanically active device 120, causing the electromechanically active device 120 to vibrate at ultrasonic frequencies, for example, through deformation or movement of the electrically active material 124 in response to the electrical current. This may also allow for the supply to the PCB 165 of an electrical current generated through deformation of the electromechanically active device 120 when the electromechanically active device 120 is vibrated by received ultrasonic acoustic waves. The top surface of the electromechanically active device 120 may be level with, or slightly below, the top surface of the substrate 160.

The membrane 190 may be cut to an appropriate size for the ultrasonic transducer 100, or an electromechanical transducer array including the ultrasonic transducer 100. For example, the membrane 190 may be slightly larger than the area which the membrane 190 is intended to cover an electromechanical transducer array. The membrane 190 may be any suitable light and stiff material for vibrating at ultrasonic frequencies, such as, for example, aluminum shim stock, metal-patterned Kapton, or any other metal-patterned film. The membrane 190 may also include suitable patterned structures.

The ultrasonic transducer 100, with a section of the membrane 190, the substrate 160, and the PCB 165, may form a transducer cell 195 of an electromechanical transducer array. An electromechanical transducer array may include any number of transducer cells, such as the transducer cell 195, arranged in any suitable manner.

Figure 2:
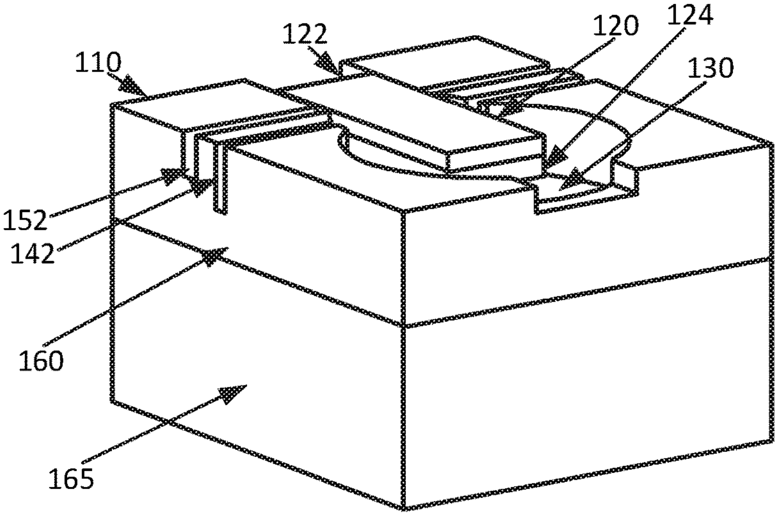
FIG. 2 shows an example ultrasonic transducer according to an implementation of the disclosed subject matter.

FIG. 2 shows an example ultrasonic transducer according to an implementation of the disclosed subject matter. The electromechanically active device 120 may be bonded to the first step and the second step of the substrate 160. The top electromechanically active device 120 may be level, or close to level, with the top of the substrate 160, and the tip of the electromechanically active device 120 may project about halfway out over the main cavity 130.

Figure 3:
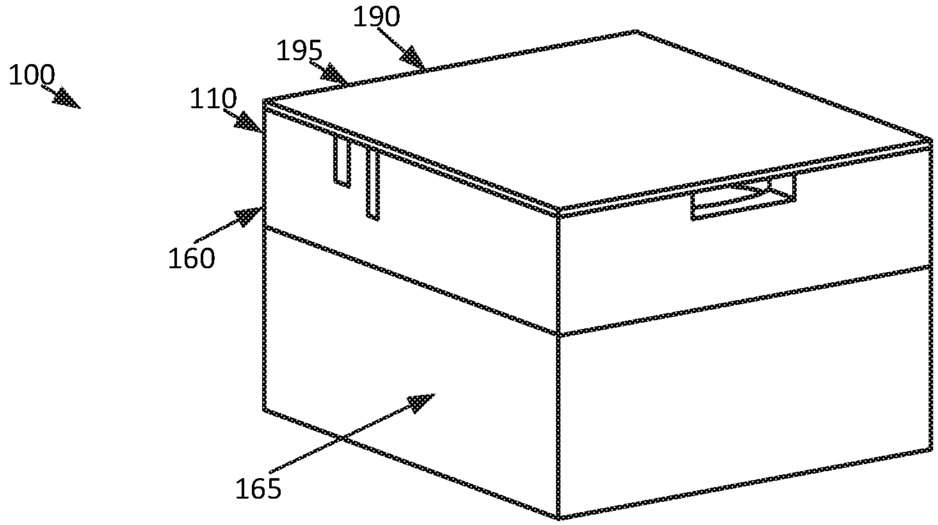
FIG. 3 shows an example ultrasonic transducer according to an implementation of the disclosed subject matter.

FIG. 3 shows an example ultrasonic transducer according to an implementation of the disclosed subject matter. The membrane 190 may be placed on the ultrasonic transducer 100, and may be bonded to the substrate 160 using any suitable technique. For example, the membrane 190 may be bonded to the substrate 160 using epoxy. A section of the membrane 190 may cover the ultrasonic transducer 100, and may be bonded to the electromechanically active device 120 near the tip of the electromechanically active device 120. The section of the membrane 190 may be bonded to the borders of the transducer cell 195, and may wholly or partially seal the main cavity 130 and secondary cavity 140.

Figure 4A:
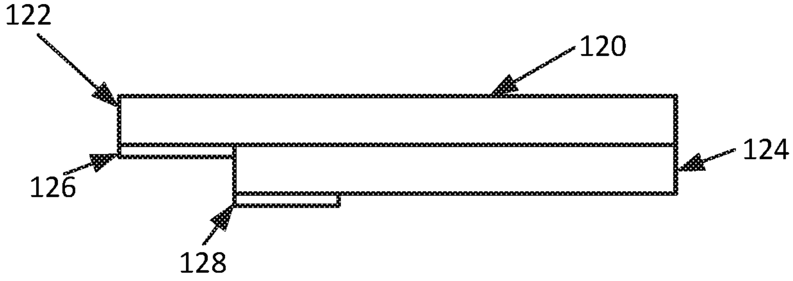
FIG. 4A shows an example electromechanically active device according to an implementation of the disclosed subject matter.

FIG. 4A shows an example electromechanically active device according to an implementation of the disclosed subject matter. The electrically passive material 122 may be longer than the electrically active material 124. The electrically passive material 122 and the electrically active material 124 may be aligned on one end of the electromechanically active device 120, and the electrically passive material 122 may extend beyond the electrically active material 124 on the other end of the electromechanically active device 120. The overhang, or tail, created by the electrically passive material 122 may allow the electromechanically active device 120 to fit into the step structure of the substrate 160, including the first step and the second step. In some implementations, the electromechanically active device 120 may be a bimorph or a trimorph, and the tail may be any suitable combination of electrically active materials and electrically passive materials.

Figure 4B:
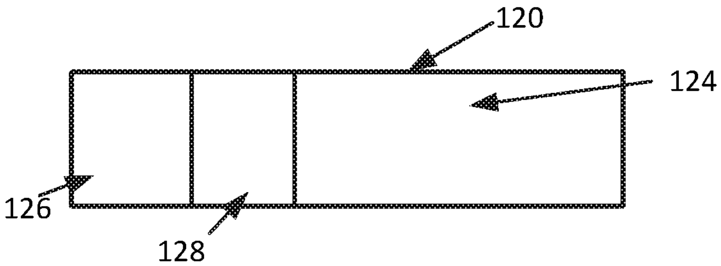
FIG. 4B shows an example electromechanically active device according to an implementation of the disclosed subject matter.

FIG. 4B shows an example electromechanically active device according to an implementation of the disclosed subject matter. The underside of the electromechanically active device 120 may include the underside of the electrically active material 124 and its electrode 128. The electrode 126 may cover the portion of the underside of the electrically passive material 122 that is not bonded to top of the electrically active material 124.

Figure 5:
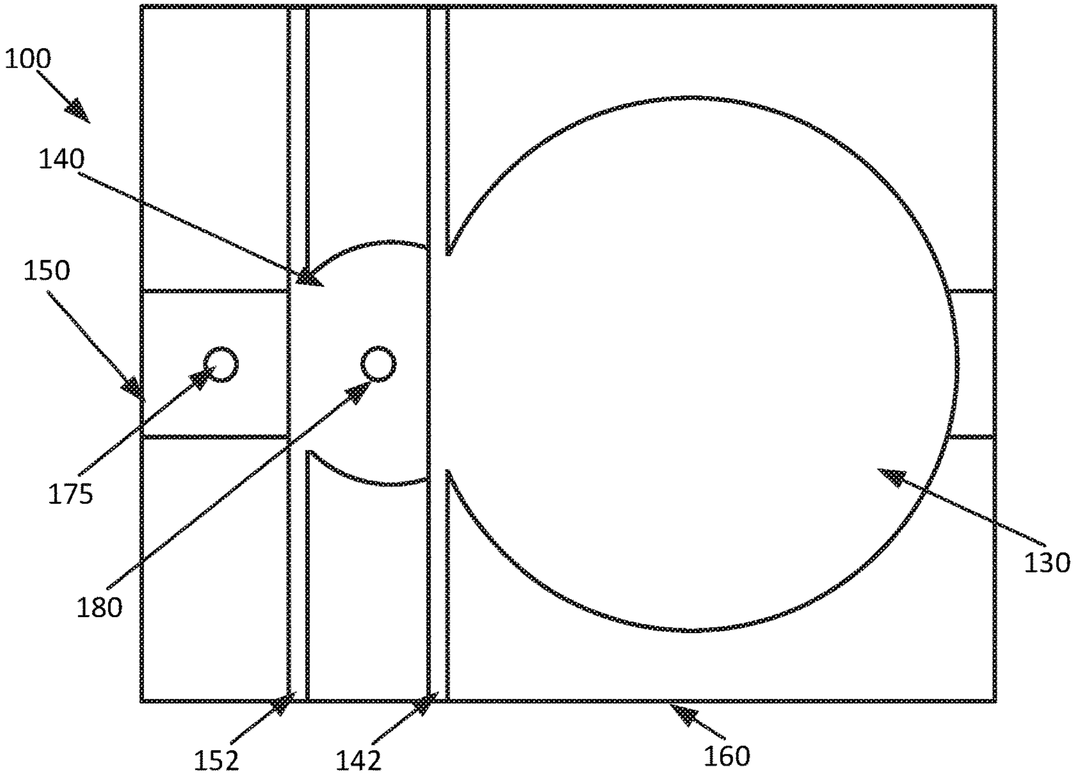
FIG. 5 shows an example ultrasonic transducer according to an implementation of the disclosed subject matter.

FIG. 5 shows an example ultrasonic transducer according to an implementation of the disclosed subject matter. The trench 142 may be created at the edge of the main cavity 130, at the location where the main cavity 130 meets the secondary cavity 140. The trench 142 may have the same depth as the main cavity 130, and may, for example, flatten out the circular edge of the main cavity 130, creating a flat riser for the first step from the main cavity 130 to the secondary cavity 140. The trench 152 may be created at the edge of the secondary cavity 140, at the location where the secondary cavity 140 meets the channel 150. The trench 152 may have the same depth as the secondary cavity 140, and may, for example, flatten out the circular edge of the secondary cavity 140, creating a flat riser for the second step from the secondary cavity 140 to the channel 150.

Figure 6A:
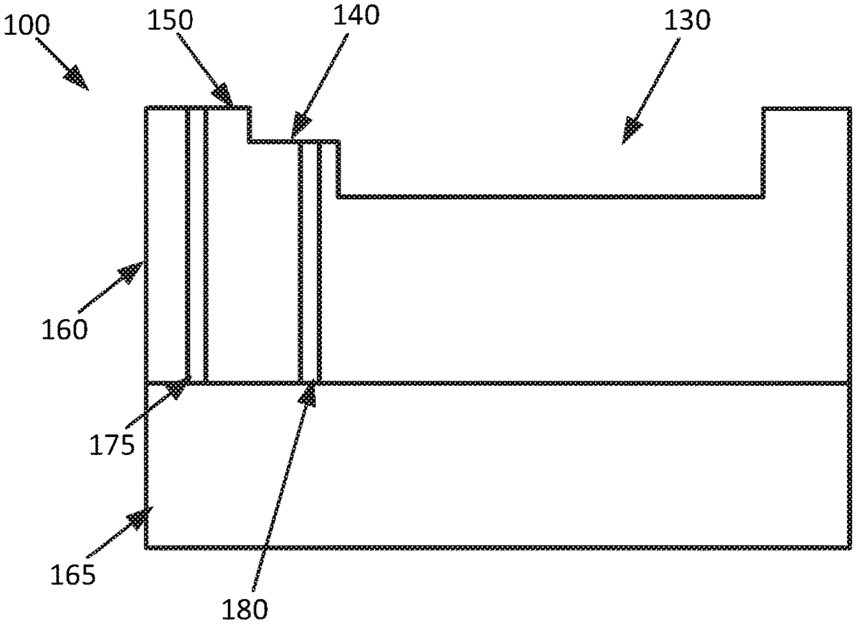
FIG. 6A shows an example cross-sectional view of an ultrasonic transducer according to an implementation of the disclosed subject matter.

FIG. 6A shows an example cross-sectional view of an ultrasonic transducer according to an implementation of the disclosed subject matter. The vias 175 and 180 may descend through the depth of the substrate 160 to the PCB 165. This may allow the vias 175 and 180 to carry electricity from the PCB 165, and components thereof, to the tread of the first step, in the secondary cavity 140, and the tread of the second step, in the channel 150.

Figure 6B:
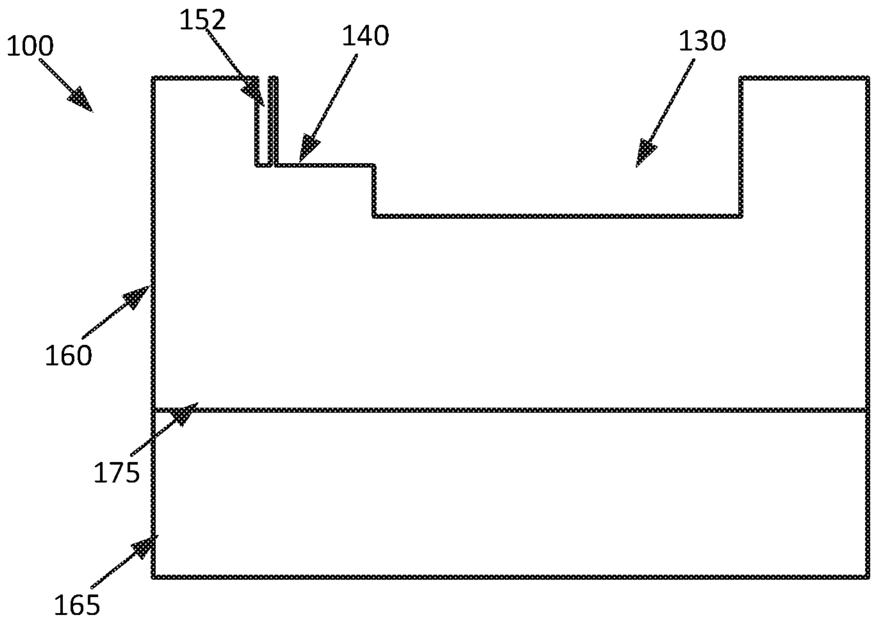
FIG. 6B shows an example cross-sectional view of an ultrasonic transducer according to an implementation of the disclosed subject matter.

FIG. 6B shows an example cross-sectional view of an ultrasonic transducer according to an implementation of the disclosed subject matter. The substrate 160 may be highest on either side of the channel 150. The trench 152 may be cut through the width of the substrate 160.

Figure 6C:
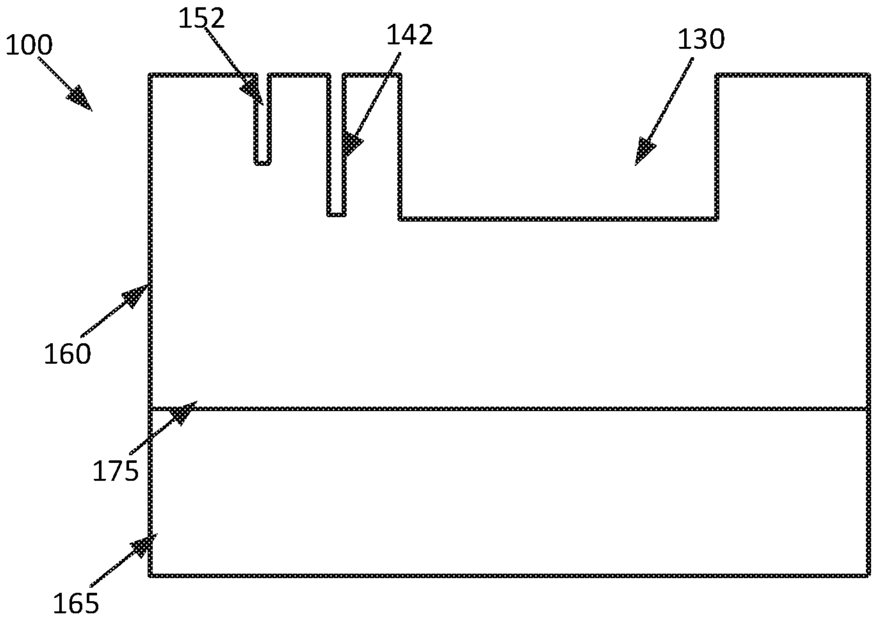
FIG. 6C shows an example cross-sectional view of an ultrasonic transducer according to an implementation of the disclosed subject matter.

FIG. 6C shows an example cross-sectional view of an ultrasonic transducer according to an implementation of the disclosed subject matter. The substrate 160 may be highest on either of the secondary cavity 140. The trench 142 may be cut through the width of the substrate 160.

Figure 7:
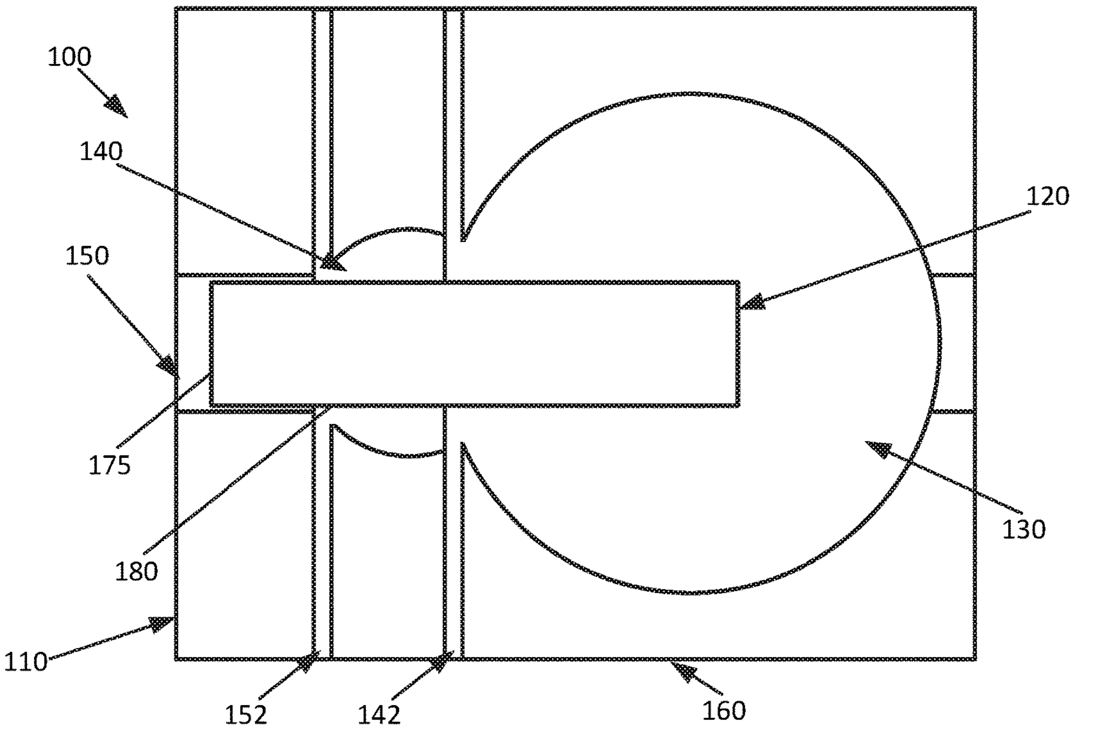
FIG. 7 shows an example cross-sectional view of an ultrasonic transducer according to an implementation of the disclosed subject matter.

FIG. 7 shows an example cross-sectional view of an ultrasonic transducer according to an implementation of the disclosed subject matter. The electromechanically active device 120 may be bonded to the substrate 160 in any suitable manner. The electromechanically active device 120 may be aligned in the substrate 160 so that a free end of the electromechanically active device 120 projects out and is suspended over the main cavity 130 approximately halfway to the far side of the main cavity 130 from where the first step and second step are located.

Figure 8A:
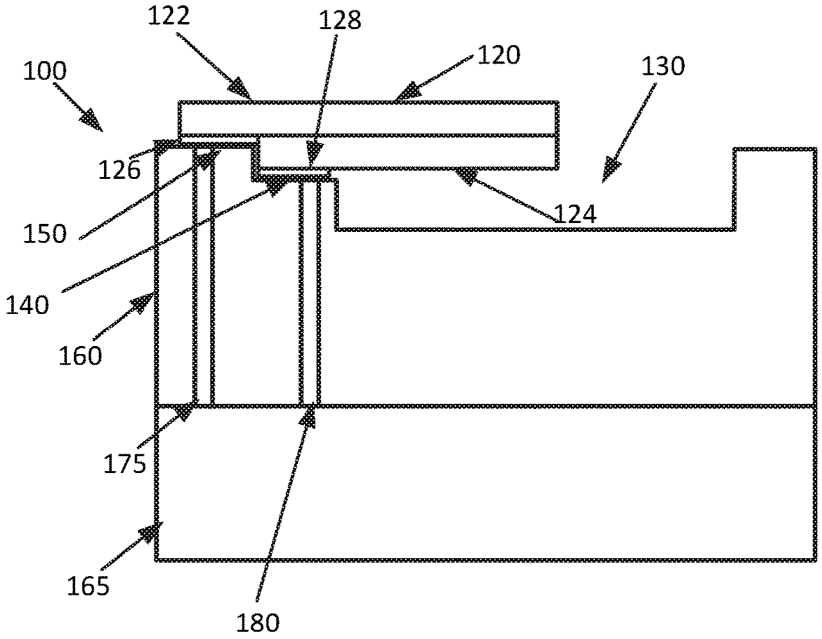
FIG. 8A shows an example cross-sectional view of an ultrasonic transducer according to an implementation of the disclosed subject matter.

FIG. 8A shows an example cross-sectional view of an ultrasonic transducer according to an implementation of the disclosed subject matter. The electrode 128 may be bonded to the tread of the first step, in the secondary cavity 140. The electrode 128 may make electrical contact with the via 180, for example, through a conductive epoxy, electrically connecting the electrode 128, and the electrically active material 124, to the PCB 165 and its components. The electrode 126 may be bonded to the tread of the second step, in the channel 150. The electrode 126 may make electrical contact with the via 175, for example, through a conductive epoxy, electrically connecting the electrode 126, and the electrically passive material 122, to the PCB 165 and its components. The electrical connections to the PCB 165 through the vias 175 and 180 may allow the electromechanically active device 120 to be driven by electrical signals supplied through the PCB 165, or to supply an electrical signal to the PCB 165 when the electromechanically active device 120 is driven by received ultrasonic acoustic waves. For example, a power source and/or power storage may be part of, or connected to, the PCB 165, and may supply electricity that may be used to drive the electromechanically active device 120 through the vias 175 and 180, causing the electromechanically active device 120 to vibrate at ultrasonic frequencies, or to store electricity generated by the electromechanically active device 120 when the electromechanically active device 120 is caused to vibrate by ultrasonic acoustic waves.

Figure 8B:
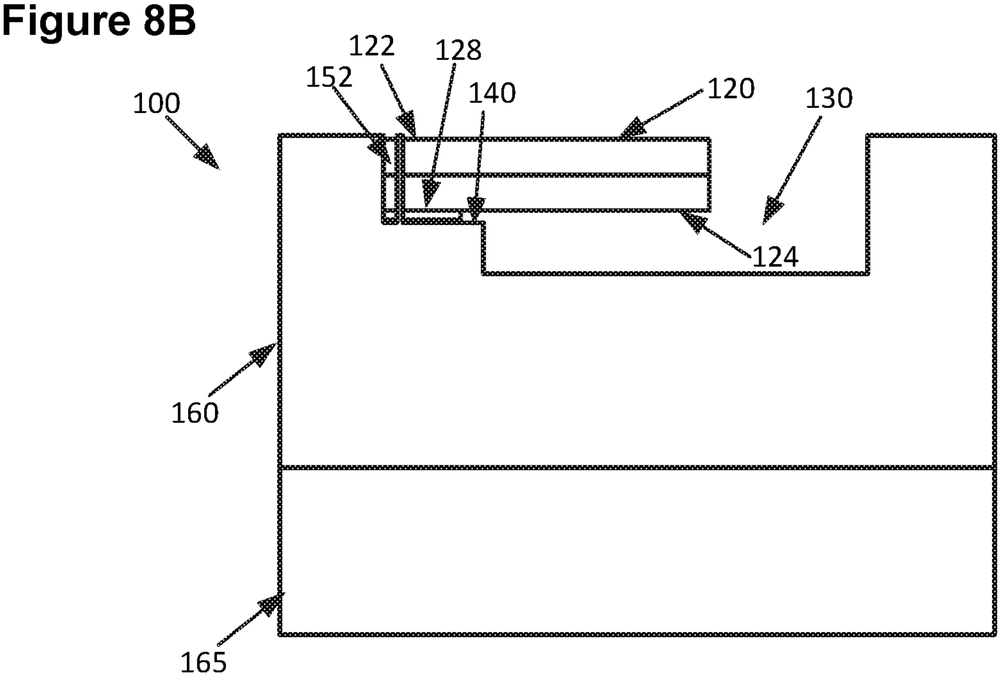
FIG. 8B shows an example cross-sectional view of an ultrasonic transducer according to an implementation of the disclosed subject matter.

FIG. 8B shows an example cross-sectional view of an ultrasonic transducer according to an implementation of the disclosed subject matter. The top of the electromechanically active device 120 may be at, or near, level with the top of the substrate 160 of the ultrasonic transducer 100.

Figure 8C:
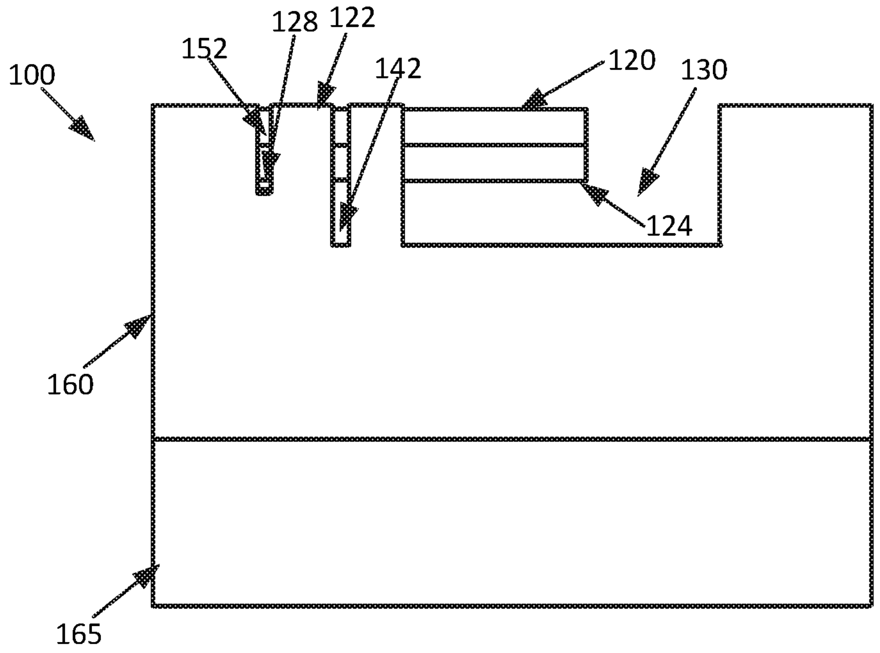
FIG. 8C shows an example cross-sectional view of an ultrasonic transducer according to an implementation of the disclosed subject matter.

FIG. 8C shows an example cross-sectional view of an ultrasonic transducer according to an implementation of the disclosed subject matter. The free end of the electromechanically active device 120 may extend out over the main cavity 130, and may have room to move downwards within the main cavity 130.

Figure 9A:
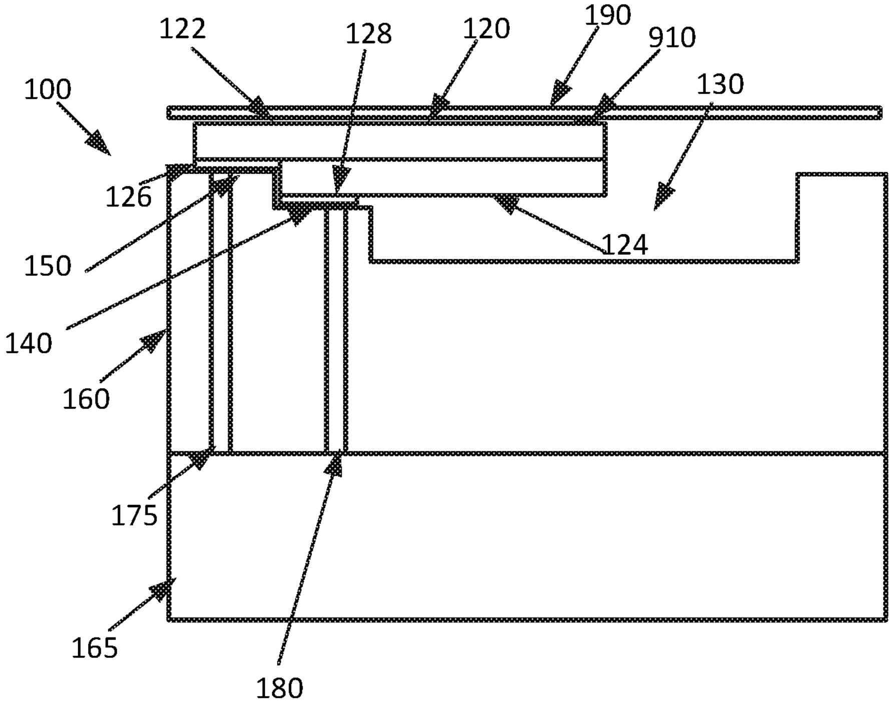
FIG. 9A shows an example cross-sectional view of an ultrasonic transducer according to an implementation of the disclosed subject matter.

FIG. 9A shows an example cross-sectional view of an ultrasonic transducer according to an implementation of the disclosed subject matter. The membrane 190 may be bonded to the ultrasonic transducer 100. For example, the membrane 190 may be bonded to the tip of the electromechanically active device 120 by bonding structure 910. The bonding structure 910 may hold the membrane 190 above the top surface of the electromechanically active device 120. The bonding structure 910 may be, for example, a dot of epoxy which may have any suitable thickness, and may act as a standoff between the membrane 190 and the tip of the electromechanically active device 120 while bonding them together. The bonding structure 910 may also be a small standoff made of any suitable material, such as a metal, ceramic, or plastic, and may be bonded to both the electromechanically active device 120 and the membrane 190. The tip of the electromechanically active device 120 may be slightly off the center of the section of the membrane 190 that covers the ultrasonic transducer 100.

Figure 9B:
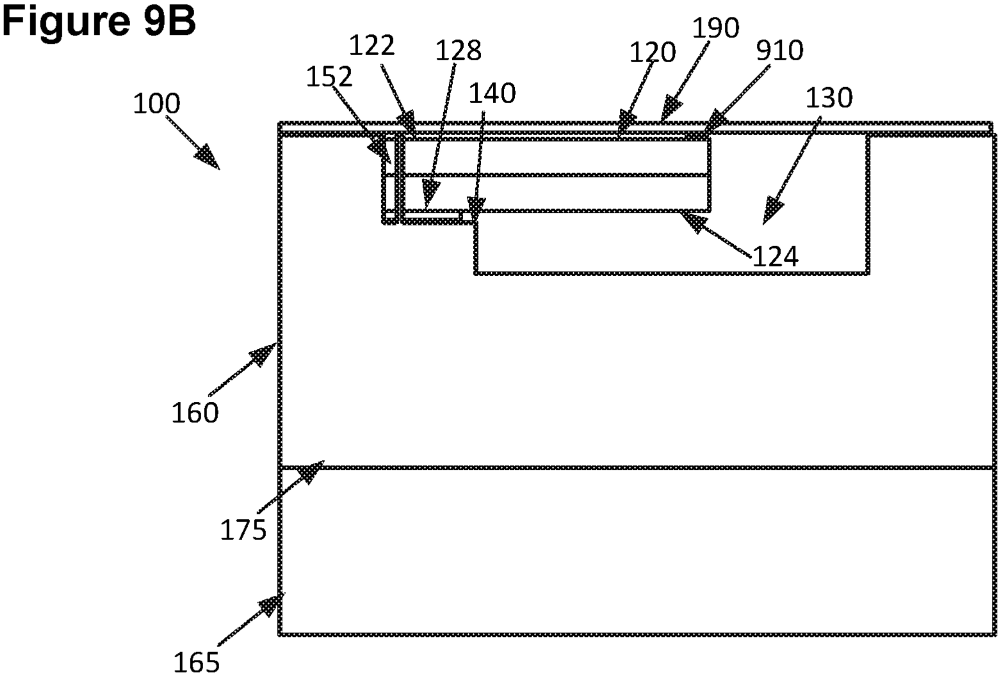
FIG. 9B shows an example cross-sectional view of an ultrasonic transducer according to an implementation of the disclosed subject matter.

FIG. 9B shows an example cross-sectional view of an ultrasonic transducer according to an implementation of the disclosed subject matter. The membrane 190 may be bonded to the ultrasonic transducer 100 so that the edges of the section of the membrane 190 that covers the ultrasonic transducer 100 are on the edges of the transducer cell 195 for the ultrasonic transducer 100. The membrane 190 may cover the main cavity 130, the secondary cavity 140, and the channel 150.

Figure 9C:
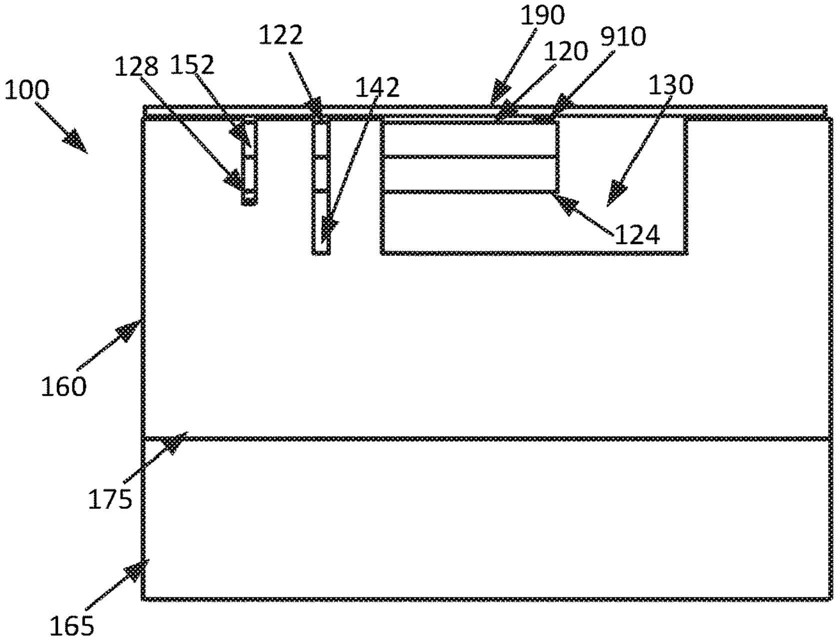
FIG. 9C shows an example cross-sectional view of an ultrasonic transducer according to an implementation of the disclosed subject matter.

FIG. 9C shows an example cross-sectional view of an ultrasonic transducer according to an implementation of the disclosed subject matter. The free end of the electromechanically active device 120 may extend out over the main cavity 130, and may have room to move downwards within the main cavity 130, pulling the membrane 190 into the main cavity 130.

Figure 10:
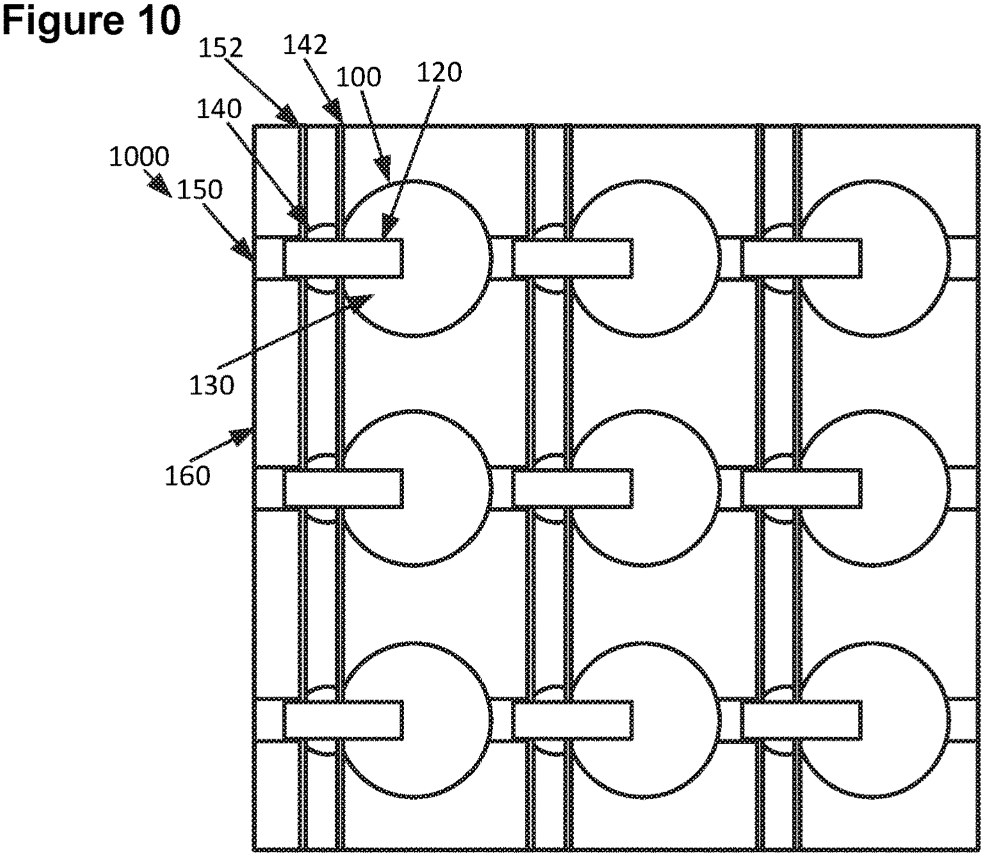
FIG. 10 shows an example electromechanical transducer array according to an implementation of the disclosed subject matter.

FIG. 10 shows an example electromechanical transducer array according to an implementation of the disclosed subject matter. An electromechanical transducer array 1000 may include any number of ultrasonic transducers, such as the ultrasonic transducer 100. The ultrasonic transducers may be arranged in any suitable manner, such as, for example, in a grid pattern. The trenches 152 and 142 may cross multiple ultrasonic transducers. The ultrasonic transducers of the electromechanical transducer array 1000 may share the same substrate 160, which may be a continuous piece of substrate material, such as, for example, FR-4, or a metal such as aluminum which may provide more rigidity to the electromechanical transducer array 1000 than FR-4. In some implementations, separate pieces of substrate material may be used, for example, with each piece of substrate material having one ultrasonic transducer, or multiple ultrasonic transducers, creating physically separate ultrasonic transducers, or separate groups of ultrasonic transducers. The separate, or separate groups of, ultrasonic transducers may be attached to the same PCB 165.

Figure 11:
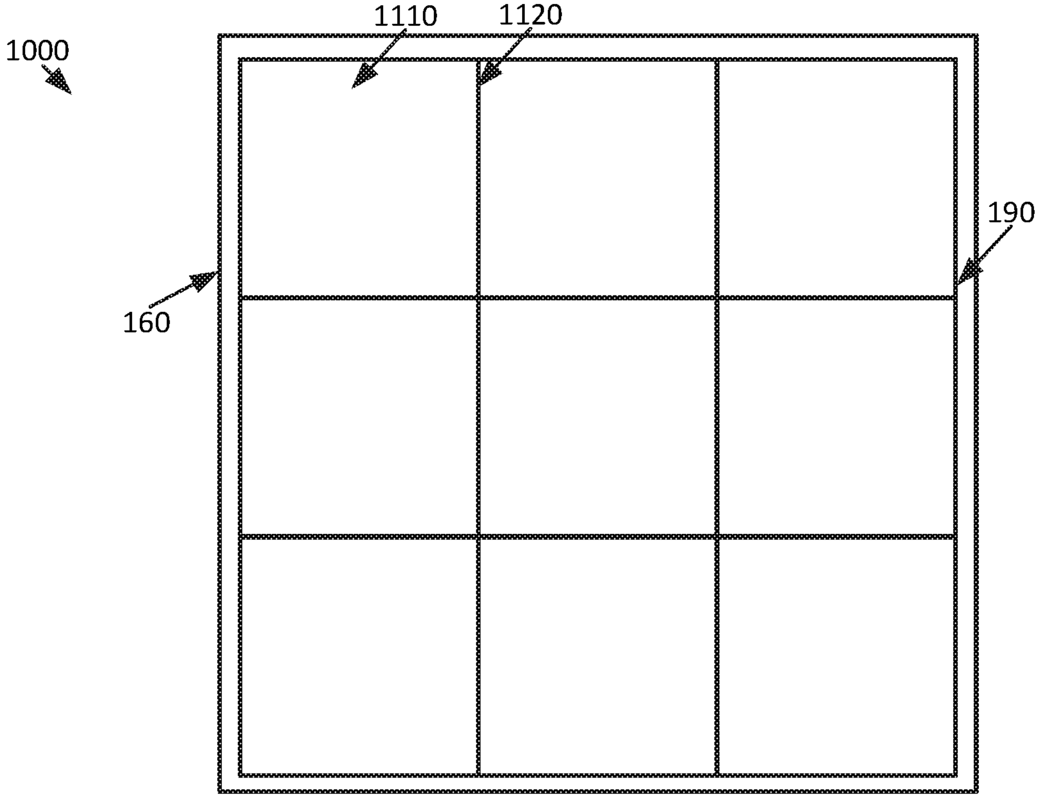
FIG. 11 shows an example electromechanical transducer array according to an implementation of the disclosed subject matter.

FIG. 11 shows an example electromechanical transducer array according to an implementation of the disclosed subject matter. The membrane 190 may have several membrane sections, such as the membrane section 1110, which may be defined by membrane borders 1120 formed where the membrane 190 is bonded to the substrate 160 of the electromechanical transducer array 1000. For example, the membrane borders 1120 may be formed by lines of epoxy that bond the membrane 190 to the substrate 160. Each membrane section, such as the membrane section 1100, of the membrane 190 may cover an ultrasonic transducer, such as the ultrasonic transducer 100, of the electromechanical transducer array 1000. The membrane borders 1120 may form the outlines of the transducer cells, such as the transducer cell 195, for each ultrasonic transducer.

Figure 12A:
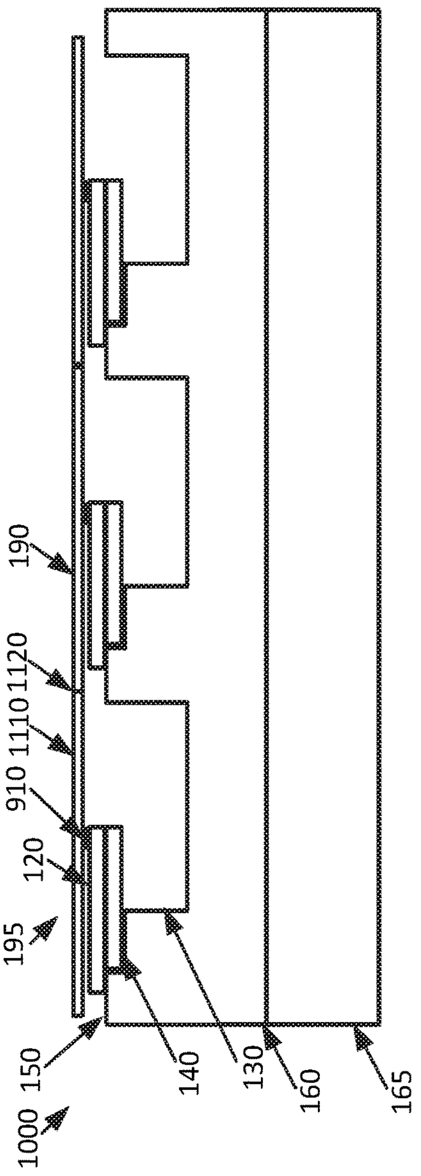
FIG. 12A shows an example ultrasonic device according to an implementation of the disclosed subject matter.

FIG. 12A shows an example ultrasonic device according to an implementation of the disclosed subject matter. The membrane section 1110 of the membrane 190 may cover the ultrasonic transducer 100 of the electromechanical transducer array 1000. The membrane borders 1120, which may be, for example, bond lines formed by cured epoxy, may mechanically isolate membrane sections from each other through attachment of the membrane 190 to the substrate 160. The membrane sections 1110 may be held above the top surface of the electromechanically active device 120 by the bonding structure 910. The bonding structure 910 may bond the tip of the electromechanically active device 120 slightly off the center of the membrane section 1110.

Figure 12B:
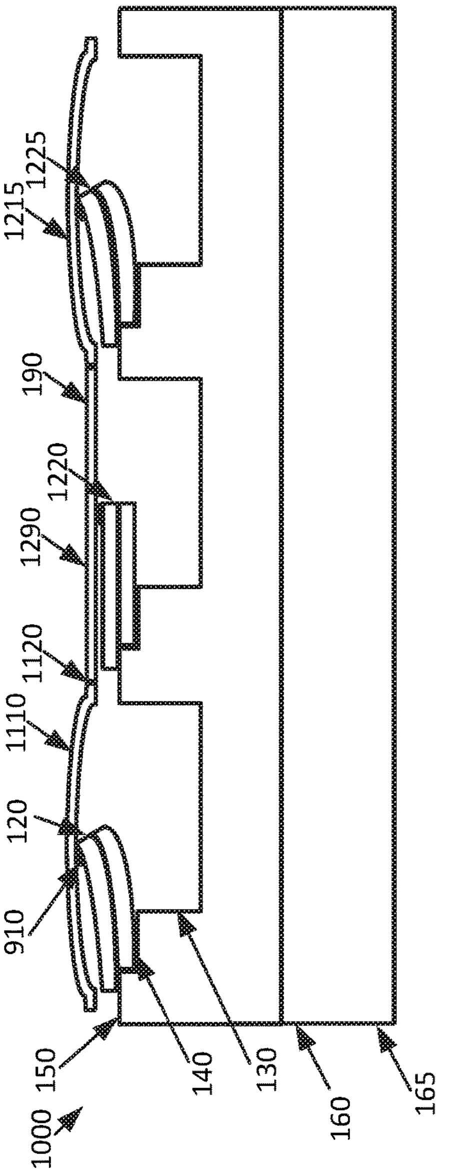
FIG. 12B shows an example ultrasonic device according to an implementation of the disclosed subject matter.

FIG. 12B shows an example ultrasonic device according to an implementation of the disclosed subject matter. The membrane sections, such as membrane sections 1110, 1215, and 1290, of the membrane 190 may be mechanically isolated from each other by the bond between the membrane 190 and the substrate 160, for example, at the membrane borders 1120. For example, when the electromechanically active device 120 is activated and flexes upward, the membrane section 1110 may be pushed upwards at the location of the bonding structure 910. Because the bonding structure 910 may be slightly off center, the membrane section 1110 may be pushed upwards at its center by the bonding structure 910 and the flexed tip of the electromechanically active device 120. The bond at the membrane borders 1120 may mechanically isolate the membrane section 1110 from neighboring membrane section 1290, so that movement of the membrane section 1110 due to movement of the electromechanically active device 120 does not cause any movement or disturbance of the membrane section 1290. Similarly, the electromechanically active device 1225 may be activated and flex upward, pushing up the membrane section 1215. The neighboring membrane section 1290 may be mechanically isolated from the membrane section 1215 by the bond between the membrane 190 and the substrate 160 at the membrane borders 1120. The ultrasonic transducers, such as the ultrasonic transducer 100, of an electromechanical transducer array 1000 may thus generate acoustic waves at ultrasonic frequencies independent of neighboring ultrasonic transducers, through independent movement of the membrane sections, such as the membrane sections 1100, 1215, and 1290.

Figure 13:
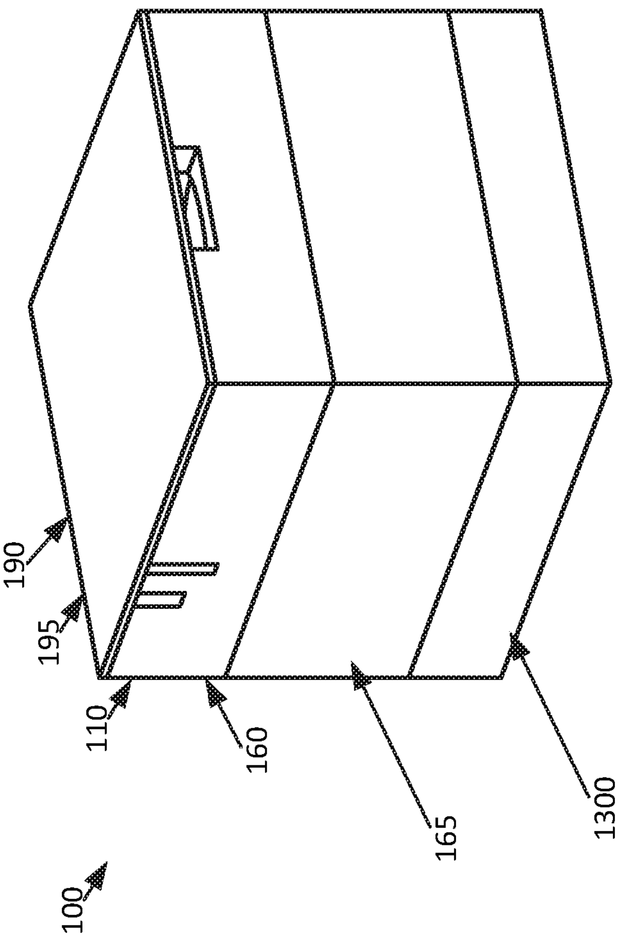
FIG. 13 shows an example ultrasonic transducer according to an implementation of the disclosed subject matter.

FIG. 13 shows an example ultrasonic transducer according to an implementation of the disclosed subject matter. A rigid mass 1300 may be added to the ultrasonic transducer 100. The rigid mass 1300 may be bonded to the back of the PCB 165 of the ultrasonic transducer 100 in any suitable manner, for example, using any suitable adhesive, bonding agent, or epoxy. The rigid mass 1300 may be, for example, a sheet or plate of aluminum, copper, silicon/aluminum alloy, or silicon, and may be used to enhance the rigidity of the ultrasonic transducer 100. This may reduce unwanted vibrations of the ultrasonic transducer 100 when the electromechanically active device 120 is vibrating, and moving the membrane 190, at ultrasonic frequencies. The rigid mass 1300 may be added to the ultrasonic transducer 100 when the substrate 160 is a less rigid material, such as FR-4. The rigid mass 1300 may also be added to the ultrasonic device 100 when the substrate 160 is a more rigid material, such as aluminum, to further enhance the rigidity of the ultrasonic transducer 100. In some implementations, the rigid mass 1300 may be bonded to the back of the substrate 160 instead of to the PCB 165, or an additional rigid mass may be bonded to the back of the substrate 160.

Figure 14:
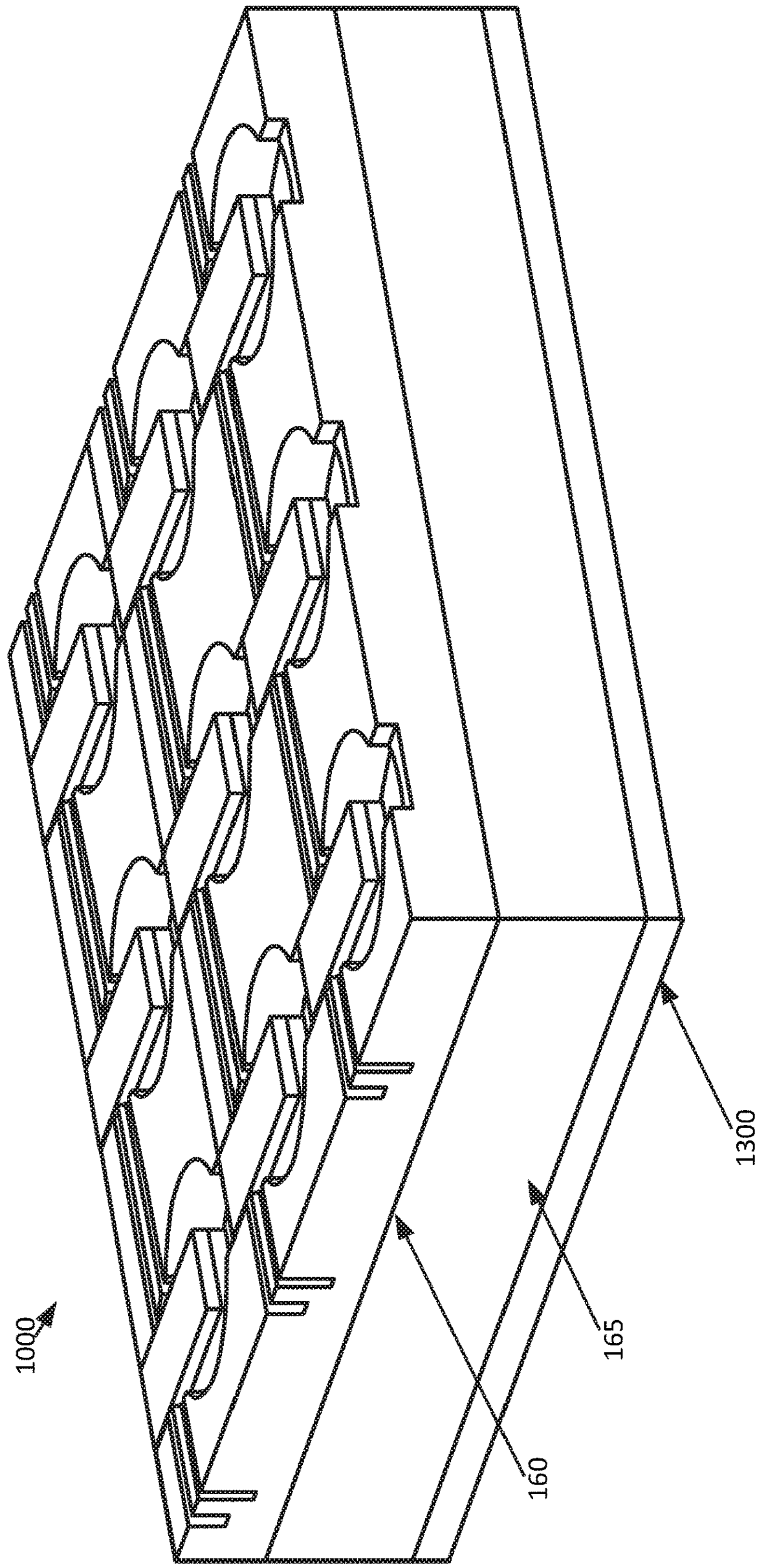
FIG. 14 shows an example electromechanical transducer array according to an implementation of the disclosed subject matter.

FIG. 14 shows an example electromechanical transducer array according to an implementation of the disclosed subject matter. The rigid mass 1300 may be bonded to the back of the PCB 165 of the electromechanical transducer array 1000, and the ultrasonic transducers of the electromechanical transducer array 1000. The rigid mass 1300 may reduce unwanted vibrations of the ultrasonic transducers of the electromechanical transducer array 1000. In some implementations, the rigid mass 1300 may be bonded to the back of the substrate 160 instead of to the PCB 165, or an additional rigid mass may be bonded to the back of the substrate 160.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. An ultrasonic transducer comprising:

a substrate comprising a main cavity, a secondary cavity, and a channel, wherein the main cavity has a greater depth than the secondary cavity, the secondary cavity has a greater depth than the channel, a first step is formed at a location between the main cavity and the secondary cavity, and a second step is formed at a location between the secondary cavity and the channel overlap;

an electromechanically active device attached to the substrate at the first step and the second step such that a free end of the electromechanically active device is suspended over a bottom of the main cavity; and a membrane bonded to the substrate such that the membrane covers the main cavity and the secondary cavity and is bonded to the free end of the electromechanically active device such that vibration of the electromechanically active device at ultrasonic frequencies causes the membrane to vibrate at ultrasonic frequencies.

2. The ultrasonic transducer of claim 1, wherein the membrane comprises a material impedance matched with the air.

3. The ultrasonic transducer of claim 1, wherein the substrate further comprises a first trench creating a flat riser for the first step and a second trench creating a flat riser for the second step.

4. The ultrasonic transducer of claim 1, further comprising a PCB bonded to the substrate, the PCB comprising at least one conductive layer.

5. The ultrasonic transducer of claim 4, further comprising a first via disposed in the first step and a second via disposed in the second step, the first via and the second via descending through the substrate to connect the at least one conductive layer of the PCB.

6. The ultrasonic transducer of claim 5, wherein a first electrode of the electromechanically active device is bonded to the first via and a second electrode of the electromechanically active device is bonded to the second via.

7. The ultrasonic transducer of claim 1, wherein the substrate comprises a material with greater rigidity than FR-4.

8. The ultrasonic transducer of claim 4, further comprising a rigid mass bonded to the PCB.

9. The ultrasonic transducer of claim 1, wherein the electromechanically active device comprises a piezoceramic unimorph or a piezoceramic bimorph.

* * * * *